(12) United States Patent
Huh et al.

(10) Patent No.: US 11,955,432 B2
(45) Date of Patent: Apr. 9, 2024

(54) ANTENNA STRUCTURE AND IMAGE DISPLAY DEVICE INCLUDING THE SAME

(71) Applicant: DONGWOO FINE-CHEM CO., LTD., Jeollabuk-do (KR)

(72) Inventors: Yoon Ho Huh, Seoul (KR); Young Ju Kim, Gyeonggi-do (KR); Young Su Lee, Gyeonggi-do (KR)

(73) Assignee: DONGWOO FINE-CHEM CO., LTD., Jeollabuk-Do (KR)

(*) Notice: Subject to any disclaimer, the term of this patent is extended or adjusted under 35 U.S.C. 154(b) by 75 days.

(21) Appl. No.: 17/554,036

(22) Filed: Dec. 17, 2021

(65) Prior Publication Data

US 2022/0199542 A1 Jun. 23, 2022

(30) Foreign Application Priority Data

Dec. 17, 2020 (KR) .................. 10-2020-0177303

(51) Int. Cl.
*H01Q 1/24* (2006.01)
*G09F 9/30* (2006.01)
*H01L 23/538* (2006.01)
*H01L 23/66* (2006.01)
*H01Q 1/38* (2006.01)
*H01Q 1/40* (2006.01)

(52) U.S. Cl.
CPC .......... *H01L 23/5389* (2013.01); *G09F 9/301* (2013.01); *H01L 23/66* (2013.01); *H01Q 1/243* (2013.01)

(58) Field of Classification Search
CPC ............ H01Q 1/24; H01Q 1/243; H01Q 1/38; H01Q 1/40; H01Q 1/48; H01Q 13/08; H01L 23/5389; H01L 23/66; G09F 9/301
See application file for complete search history.

(56) References Cited

U.S. PATENT DOCUMENTS

| | | | |
|---|---|---|---|
| 2018/0188432 A1* | 7/2018 | Choi | H10K 50/86 |
| 2020/0153114 A1* | 5/2020 | Wada | H01Q 21/065 |
| 2020/0379607 A1* | 12/2020 | Oh | H01Q 21/065 |
| 2022/0276682 A1* | 9/2022 | Yu | G02F 1/133305 |
| 2022/0328955 A1* | 10/2022 | Park | H01Q 1/48 |

FOREIGN PATENT DOCUMENTS

KR 10-2013-0113222 A 10/2013

* cited by examiner

*Primary Examiner* — Thai Pham
(74) *Attorney, Agent, or Firm* — The PL Law Group, PLLC

(57) ABSTRACT

An antenna structure according to an embodiment of the present disclosure includes a passivation layer, an antenna unit at least partially embedded in an upper portion of the passivation layer, and an insulating layer disposed on a top surface of the passivation layer to cover the antenna unit. A spatial efficiency of the antenna structure is improved and a thickness of the image display device is reduced to improve a bending property.

14 Claims, 6 Drawing Sheets

ANTENNA STRUCTURE AND IMAGE DISPLAY DEVICE INCLUDING THE SAME

CROSS-REFERENCE TO RELATED APPLICATION AND CLAIM OF PRIORITY

This application claims priority to Korean Patent Application No. 10-2020-0177303 filed on Dec. 17, 2020 in the Korean Intellectual Property Office (KIPO), the entire disclosures of which are incorporated by reference herein.

BACKGROUND

1. Field

The present invention relates to an antenna structure and an image display device including the same. More particularly, the present invention relates to an antenna structure including an antenna unit and a passivation layer, and an image display device including the same.

2. Description of the Related Art

As information technologies have been developed, a wireless communication technology such as Wi-Fi, Bluetooth, etc., is combined with an image display device in, e.g., a smartphone form. In this case, an antenna may be combined with the image display device to provide a communication function.

Recently, as a bendable image display device such as flexible display, demands for the antenna capable of being applied to the flexible display are increasing.

However, when an additional film or structure is formed for the introduction of the antenna, an overall thickness of the flexible display may be increased, or a laminating structure for folding the flexible display may be changed. Accordingly, desirable folding or bending properties of the flexible display may be degraded.

Thus, a construction for introducing the antenna in a limited space while achieving sufficient radiation and gain properties of the antenna is required.

For example, Korean Published Patent Application No. 2013-0113222 discloses an antenna integrated into a mobile terminal, but does not sufficiently consider the antenna construction as described above.

SUMMARY

According to an aspect of the present invention, there is provided an antenna structure having improved spatial efficiency and reliability.

According to an aspect of the present invention, there is provided an image display device including an antenna structure with improved spatial efficiency and reliability.

(1) An antenna structure, including: a passivation layer; an antenna unit at least partially embedded in an upper portion of the passivation layer; and an insulating layer disposed on a top surface of the passivation layer to cover the antenna unit.

(2) The antenna structure according to the above (1), wherein the antenna unit is spaced apart from a bottom surface of the passivation layer in a thickness direction.

(3) The antenna structure of the above (2), wherein the antenna unit includes a radiator, a transmission line extending from the radiator and a signal pad connected to a terminal end portion of the transmission line.

(4) The antenna structure of the above (3), wherein the passivation layer covers the radiator, and at least partially exposes the signal pad.

(5) The antenna structure of the above (3), further including a first adhesive layer combined with a bottom surface of the passivation layer.

(6) The antenna structure of the above (5), further including a circuit board disposed between the first adhesive layer and the antenna unit to be electrically connected to the signal pad of the antenna unit.

(7) The antenna structure of the above (6), a thickness of the first adhesive layer is greater than or equal to a thickness of the circuit board.

(8) The antenna structure of the above (5), further including a second adhesive layer formed on a top surface of the insulating layer.

(9) The antenna structure of the above (1), wherein the top surface of the passivation layer and a top surface of the antenna unit are coplanar with each other.

(10) The antenna structure of claim 1, wherein the insulating layer includes a first insulating layer and a second insulating layer sequentially stacked from the top surface of the passivation layer, and the first insulating layer and the second insulating layer include different insulating materials from each other.

(11) An image display device, including: a display panel; and the antenna structure according to embodiments as described above disposed on the display panel.

(12) The image display device of the above (11), further including a ground layer disposed under the display panel.

(13) The image display device of the above (11), wherein the antenna structure is stacked on the display panel such that a bottom surface of the passivation layer faces the display panel.

(14) The image display device of the above (13), further including: a first adhesive layer formed between the bottom surface of the passivation layer and the display panel; and a second adhesive layer formed on a top surface of the insulating layer of the antenna structure.

(15) The image display device of the above (14), wherein a thickness of the first adhesive layer is from 50 μm to 500 μm, and a thickness of the second adhesive layer is from 20 pin to 200 μm.

(16) The image display device of the above (14), further including a cover window disposed on the second adhesive layer.

(17) The image display device of the above (14), further including an optical layer disposed between the first adhesive layer and the display panel.

According to embodiments of the present invention, an antenna structure may include a passivation layer, an antenna unit pattern at least partially buried at an upper portion of the passivation layer and an insulating layer stacked on the passivation layer. The antenna unit may be included in an adhesive layer or a protective layer of an image display device without inserting an additional antenna base layer being inserted in the antenna structure.

Accordingly, a total thickness of the image display device including the antenna structure may be reduced. Thus, flexible properties and mechanical durability may be enhanced while maintaining an antenna radiation performance, so that the image display device having high reliability including an antenna may be implemented.

A first adhesive layer may be disposed between the antenna structure and a display panel of the image display device. The first adhesive layer may have a predetermined thickness range. Accordingly, excessive absorption of a signal radiated from the antenna unit by the ground layer and/or the conductive member of the display panel may be prevented, and a circuit board may be stably disposed.

In some embodiments, a ground layer may be disposed under the display panel included in the image display device. In this case, the conductive member and the ground layer of the display panel may be provided together as a ground of the antenna unit. Accordingly, a vertical radiation property of the antenna unit may be implemented with high efficiency and high reliability.

DETAILED DESCRIPTION OF THE EMBODIMENTS

According to exemplary embodiments of the present invention, there is provided an antenna structure including a buried construction of an antenna unit The antenna structure may include, e.g., a microstrip patch antenna fabricated in the form of a transparent film, a monopole antenna or a dipole antenna. The antenna structure may be applied to communication devices for a mobile communication of a high or ultrahigh frequency band corresponding to a mobile communication of, e.g., 3G, 4G, 5G or higher.

According to exemplary embodiments of the present invention, there is also provided an image display device including the antenna structure. An application of the antenna structure is not limited to the image display device, and the antenna structure may be applied to various objects or structures such as a vehicle, a home electronic appliance, an architecture, etc.

Hereinafter, the present invention will be described in detail with reference to the accompanying drawings. However, those skilled in the art will appreciate that such embodiments described with reference to the accompanying drawings are provided to further understand the spirit of the present invention and do not limit subject matters to be protected as disclosed in the detailed description and appended claims.

The terms "first", "second", "upper", "lower", "top", "bottom", "front", "rear", etc., used herein do not designate an absolute position, but are relatively used to distinguish different elements or different positions.

In the accompanying drawings, a first direction shown may be a width direction of a passivation layer 100 or the antenna structure, a second direction may be a length direction of the passivation layer 100 or the antenna structure, and the third direction may be a thickness direction of the antenna structure.

Figure 1:
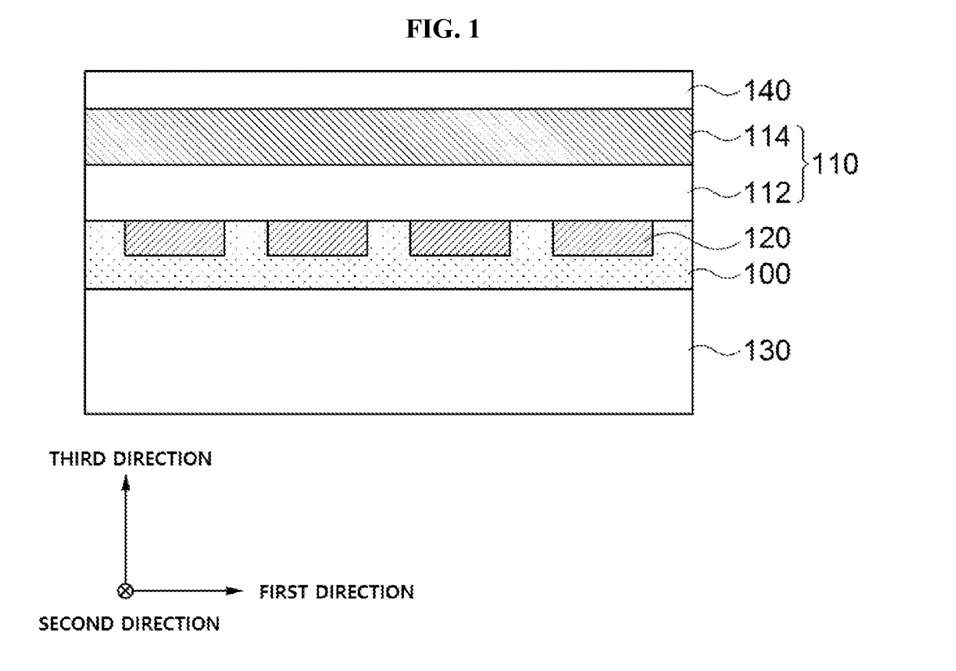
FIGS. 1 and 2 are schematic cross-sectional views illustrating an antenna structure in accordance with exemplary embodiments.
Figure 2:
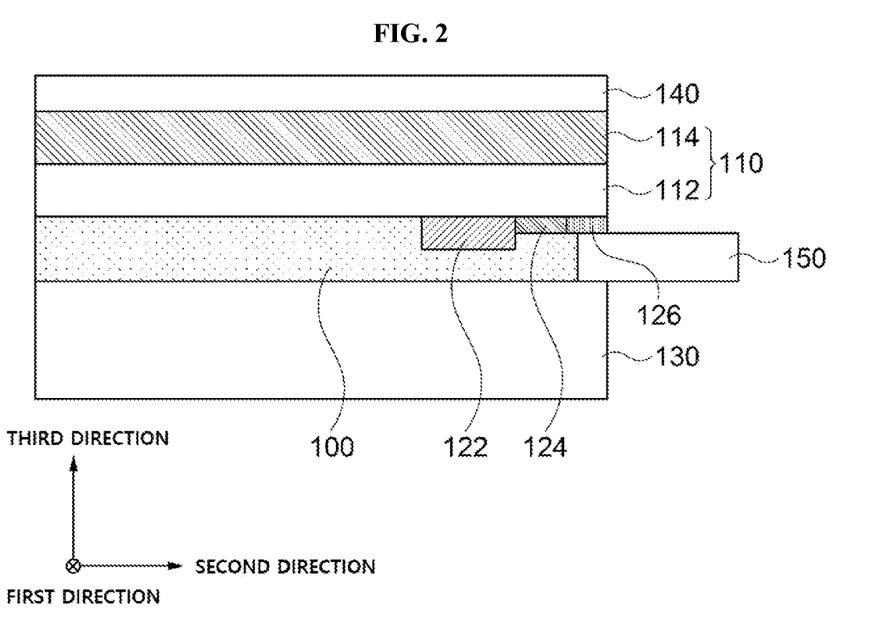

FIGS. 1 and 2 are schematic cross-sectional views illustrating an antenna structure in accordance with exemplary embodiments.

For example, FIG. 1 is a cross-sectional view taken along the first direction in the thickness direction (e.g., the third direction) of the antenna structure, and FIG. 2 is a cross-sectional view taken along the second direction in the thickness direction of the antenna structure.

Referring to FIG. 1, the antenna structure may include a passivation layer 100, an antenna unit 120 at least partially embedded at an upper portion of the passivation layer 100, and an insulating layer 110 disposed on a top surface of the passivation layer 100 to cover the antenna unit 120.

In exemplary embodiments, the passivation layer 100 may serve as an insulating layer that may electrically separate the antenna unit 120 from other materials.

The passivation layer 100 may include, e.g., an organic insulating material such as an epoxy-based resin, an acrylic resin, a siloxane-based resin or a polyimide-based resin, or an inorganic insulating material such as silicon oxide or silicon nitride.

In some embodiments, the thickness of the passivation layer 100 may be 5 μm or less. Accordingly, a thickness of the antenna structure may be reduced compared to the case of inserting an additional antenna substrate layer.

The insulating layer 110 may serve as, e.g., a substrate of the antenna unit 120. In this case, an additional substrate for the antenna unit 120 may not be inserted. Accordingly, a thickness and/or volume of the antenna structure may be reduced. Thus, a spatial efficiency of the antenna structure and an image display device including the antenna structure may be increased, and flexible property, durability, and driving reliability may also be improved.

The insulating layer 110 may include a polyester-based resin such as polyethylene terephthalate, polyethylene isophthalate, polyethylene naphthalate and polybutylene terephthalate; a cellulose-based resin such as diacetyl cellulose and triacetyl cellulose; a polycarbonate-based resin; an acrylic resin such as polymethyl (meth)acrylate and polyethyl (meth)acrylate; a styrene-based resin such as polystyrene and an acrylonitrile-styrene copolymer; a polyolefin-based resin such as polyethylene, polypropylene, a cycloolefin or polyolefin having a norbornene structure and an ethylene-propylene copolymer; a vinyl chloride-based resin; an amide-based resin such as nylon and an aromatic polyamide; an imide-based resin; a polyethersulfone-based resin; a sulfone-based resin; a polyether ether ketone-based resin; a polyphenylene sulfide resin; a vinyl alcohol-based resin; a vinylidene chloride-based resin; a vinyl butyral-based resin; an allylate-based resin; a polyoxymethylene-based resin; an epoxy-based resin; a urethane or acrylic urethane-based resin; a silicone-based resin, etc. These may be used alone or in a combination of two or more therefrom.

In some embodiments, an adhesive film such as an optically clear adhesive (OCA) or an optically clear resin (OCR) may be included in the insulating layer 110. In some embodiments, the insulating layer 110 may include an inorganic insulating material such as silicon oxide, silicon nitride, silicon oxynitride, glass, or the like.

In some embodiments, a dielectric constant of the insulating layer 110 may be adjusted in a range from about 1.5 to about 12. When the dielectric constant exceeds about 12, a driving frequency may be excessively decreased, so that driving in a desired high or ultra-high frequency band may not be implemented.

In exemplary embodiments, the insulating layer 110 may include a first insulating layer 112 and a second insulating layer 114 sequentially stacked from a top surface of the passivation layer 100.

For example, the first insulating layer 112 may serve as a protective layer capable of protecting the antenna unit 120 from an external impact during a laminating process of the antenna structure. The first insulating layer 112 may include a material selected from materials capable of serving as a protective layer such as, e.g., the organic and/or inorganic insulating material as mentioned above.

For example, the second insulating layer 114 may serve as a separation adhesive layer for attaching a carrier substrate on a top surface of the insulating layer 110 during the lamination process of the antenna structure. For example, a protective film may be attached on top surface of the insulating layer 110 after peeling off the carrier substrate.

The second insulating layer 114 may include a material in consideration of easily performing the attachment/detachment, and may include, e.g., the organic insulating material as mentioned above.

In some embodiments, the first insulating layer 112 and the second insulating layer 114 may include different dielectric materials in consideration of the above-described properties. Accordingly, the insulating layer 110 may function as both the protective layer and the separation adhesive layer.

In some embodiments, a total thickness of the insulating layer 110 may be 10 μm or less. In this case, the antenna unit 120 may be disposed on a relatively thin substrate. Accordingly, a thickness of the antenna structure may be reduced compared to the case of inserting an additional antenna substrate layer.

In some embodiments, the antenna unit 120 may be spaced apart from a bottom surface of the passivation layer 100 in the thickness direction. Accordingly, excessive signal absorption by the conductive member or the ground layer of the image display device may be prevented to improve driving reliability.

In some embodiments, top surfaces of the passivation layer 100 and the antenna unit 120 are coplanar with each other. For example, the top surface of the passivation layer 100 and the top surface of the antenna unit 120 may contact a bottom surface of the insulating layer 110.

Accordingly, at least a portion of the antenna unit 120 may be substantially covered by the passivation layer 100 so that the above-described driving reliability and insulation effect may be sufficiently implemented. Additionally, the antenna unit 120 and the passivation layer 100 may be sequentially stacked from the insulating layer 110 in a fabrication of the antenna structure, so that the antenna unit 120 may be stably formed even without the additional antenna substrate.

Referring to FIG. 2, in exemplary embodiments, the antenna unit 120 may include a radiator 122, a transmission line 124 extending from the radiator 122 and a signal pad 126 connected to a terminal end portion of the transmission line 124.

In some embodiments, the passivation layer 100 may cover the radiator 122 and at least partially expose a top surface of the signal pad 126, and the circuit board 150 may be bonded and electrically connected to an exposed portion of the signal pad 126. The circuit board 150 may include, e.g., a flexible printed circuit board (FPCB).

For example, the circuit board 150 may extend and may be electrically connected to a main board of the image display device. In this case, the antenna unit 120 and an antenna driving integrated circuit (IC) chip mounted on the main board may be electrically connected with each other. Accordingly, feeding/control signals (e.g., a phase, a beam tilting signal, etc.) may be applied from the antenna driving IC chip to the antenna unit 120.

For example, a plurality of the antenna units 120 may be embedded in the passivation layer 100 to be physically and electrically spaced apart from each other. Accordingly, the antenna structure having a relatively small thickness may be obtained while maintaining radiation performance and antenna gain of the antenna structure.

In some embodiments, the first adhesive layer 130 may be attached to the bottom surface of the passivation layer 100. For example, the circuit board 150 may be disposed between the first adhesive layer 130 and the antenna unit 120. For example, an image display device to be described later and the antenna structure may be combined by the first adhesive layer 130.

The first adhesive layer 130 may include, e.g., a transparent resin film, an adhesive material or an inorganic insulating material that may be included in the above-described insulating layer 110.

In some embodiments, a thickness of the first adhesive layer 130 may be greater than or equal to a thickness of the circuit board 150. In this case, when the circuit board 150 is disposed between the first adhesive layer 130 and the first insulating layer 112, the circuit board 150 may be stably fixed using a sufficient thickness of the first adhesive layer. Thus, the antenna structure having improved durability and reliability may be achieved.

In some embodiments, the second adhesive layer 140 may be disposed on a top surface of the insulating layer 110. For example, the second adhesive layer 140 may include substantially the same material as the material included in the first adhesive layer 130. For example, a cover window of an image display device, which will be described later, may be disposed on the insulating layer 110 via the second adhesive layer 140.

Figure 3:
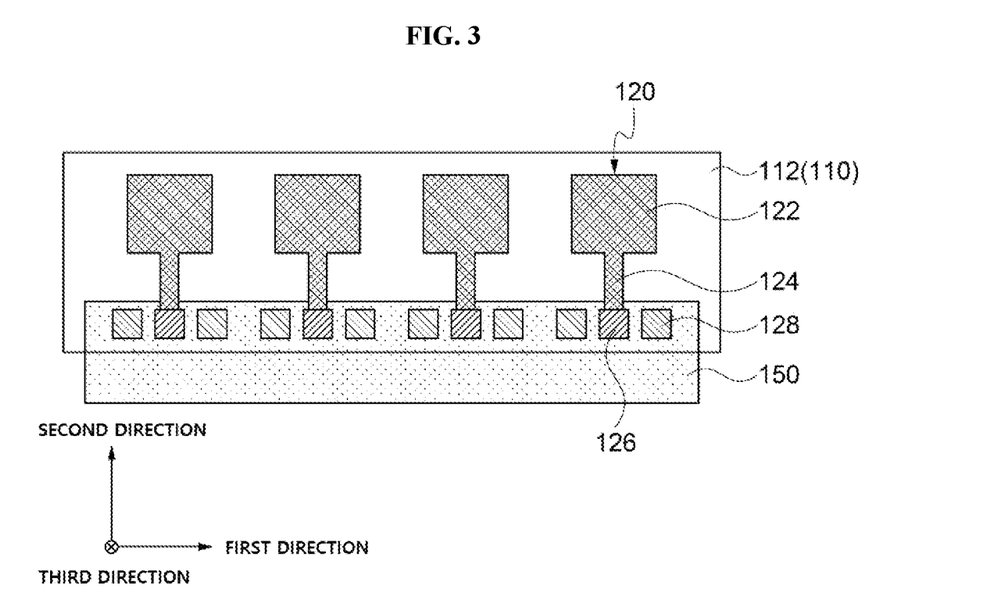
FIG. 3 is a schematic top planar view illustrating an antenna unit in accordance with exemplary embodiments.

FIG. 3 is a schematic top planar view illustrating an antenna unit in accordance with exemplary embodiments.

Referring to FIG. 3, the antenna unit 120 may be disposed on the insulating layer 110. For example, a plurality of antenna units 120 may be arranged in an array form along the width direction (e.g., the first direction) of the insulating layer 110 or the antenna structure to form an antenna pattern row.

As described above, the antenna unit 120 may include the radiator 122 and the transmission line 124. The radiator 122 may have, e.g., a polygonal plate shape, and the transmission line 124 may extend from one side of the radiator 122. The transmission line 124 may be formed as a single member substantially integral with the radiator 122, and may have a narrower width than that of the radiator 122.

The antenna unit 120 may further include the signal pad 126. The signal pad 126 may be connected to a terminal end portion of the transmission line 124. In an embodiment, the signal pad 126 may serve as a member substantially integral with the transmission line 124, and the terminal end portion of the transmission line 124 may serve as the signal pad 126.

In some embodiments, a ground pad 128 may be disposed around the signal pad 126. For example, a pair of the ground pads 128 may be disposed to face each other with the signal pad 126 interposed therebetween. The ground pad 128 may be electrically and physically separated from the transmission line 124 and the signal pad 126.

The antenna unit 120 or the radiator 122 may be designed to have, e.g., a resonance frequency corresponding to high frequency or ultra-high frequency band such as 3G, 4G, 5G or higher band. For example, the resonance frequency of the antenna unit may be about 10 GHz or more, or in a range from about 20 GHz to 45 GHz.

In some embodiments, the radiators 122 having different sizes may be arranged on the bottom surface of the insulating layer 110. In this case, the antenna unit 120 may serve as a multi-radiation or multi-band antenna radiating in a plurality of resonance frequency bands.

The antenna unit 120 may include silver (Ag), gold (Au), copper (Cu), aluminum (Al), platinum (Pt), palladium (Pd), chromium (Cr), titanium (Ti), tungsten (W), niobium (Nb), tantalum (Ta), vanadium (V), iron (Fe), manganese (Mn), cobalt (Co), nickel (Ni), zinc (Zn), tin (Sn), molybdenum (Mo), calcium (Ca) or an alloy containing at least one of the metals. These may be used alone or in combination thereof.

In an embodiment, the antenna unit 120 may include silver (Ag) or a silver alloy (e.g., silver-palladium-copper (APC)), or copper (Cu) or a copper alloy (e.g., a copper-calcium (CuCa)) to implement a low resistance and a fine line width pattern.

In some embodiments, the antenna unit 120 may include a transparent conductive oxide such as indium tin oxide (ITO), indium zinc oxide (IZO), zinc oxide (ZnOx), indium zinc tin oxide (IZTO), etc.

In some embodiments, the antenna unit 120 may include a stacked structure of a transparent conductive oxide layer and a metal layer. For example, the antenna unit may include a double-layered structure of a transparent conductive oxide layer-metal layer, or a triple-layered structure of a transparent conductive oxide layer-metal layer-transparent conductive oxide layer. In this case, flexible property may be improved by the metal layer, and a signal transmission speed may also be improved by a low resistance of the metal layer. Corrosive resistance and transparency may be improved by the transparent conductive oxide layer.

The antenna unit 120 may include a blackened portion, so that a reflectance at a surface of the antenna unit 120 may be decreased to suppress a visual recognition of the antenna unit due to a light reflectance.

In an embodiment, a surface of the metal layer included in the antenna unit 120 may be converted into a metal oxide or a metal sulfide to form a blackened layer. In an embodiment, a blackened layer such as a black material coating layer or a plating layer may be formed on the antenna unit 120 or the metal layer. The black material or plating layer may include silicon, carbon, copper, molybdenum, tin, chromium, molybdenum, nickel, cobalt, or an oxide, sulfide or alloy containing at least one therefrom.

A composition and a thickness of the blackened layer may be adjusted in consideration of a reflectance reduction effect and an antenna radiation property.

In some embodiments, the radiator 122 and the transmission line 124 may include a mesh-pattern structure to improve transmittance. In this case, a dummy mesh pattern (not illustrated) may be formed around the radiator 122 and the transmission line 124.

The signal pad 126 and the ground pad 128 may be formed as a solid pattern including the above-described metal or alloy in consideration of reduction of feeding resistance, noise absorption efficiency, improvement of a horizontal radiation property, etc.

In some embodiments, the radiator 122 may have the mesh-pattern structure, and at least a portion of the transmission line 124 may have a solid metal pattern structure.

The radiator 122 may be disposed in a display area of an image display device, and the signal pad 126 and the ground pad 128 may be disposed in a non-display area or a bezel area of the image display device. At least a portion of the transmission line 124 may also be disposed in the non-display area or the bezel area of the image display device.

The above-described antenna structure may be disposed on the image display device to provide functions of a transparent film and an antenna. The insulating layer 110 may serve as a substrate for the antenna unit 120, and thus an additional base layer or a substrate for the antenna may not be inserted.

Accordingly, a total thickness of the image display device including the antenna structure may be reduced while maintaining the antenna radiation performance, so that flexible property and durability may be improved to provide the image display device including an antenna with high reliability.

If the additional and individual substrate layer for the antenna is inserted, a neutral plane for a folding of the image display device may be changed to result in an excessive stress at a weak portion of the image display device.

However, according to exemplary embodiments, the additional antenna substrate may not be inserted, so that the neutral plane of the image display device may be maintained. Thus, a stress applied to a weak portion at an inside of the image display device may be suppressed while maintaining an antenna radiation performance. Thus, the image display device including the antenna may be implemented with enhanced folding property and reliability.

Further, an additional film or layer may not be inserted in the display area, so that a luminance reduction of the image display device may be prevented.

Figure 4:
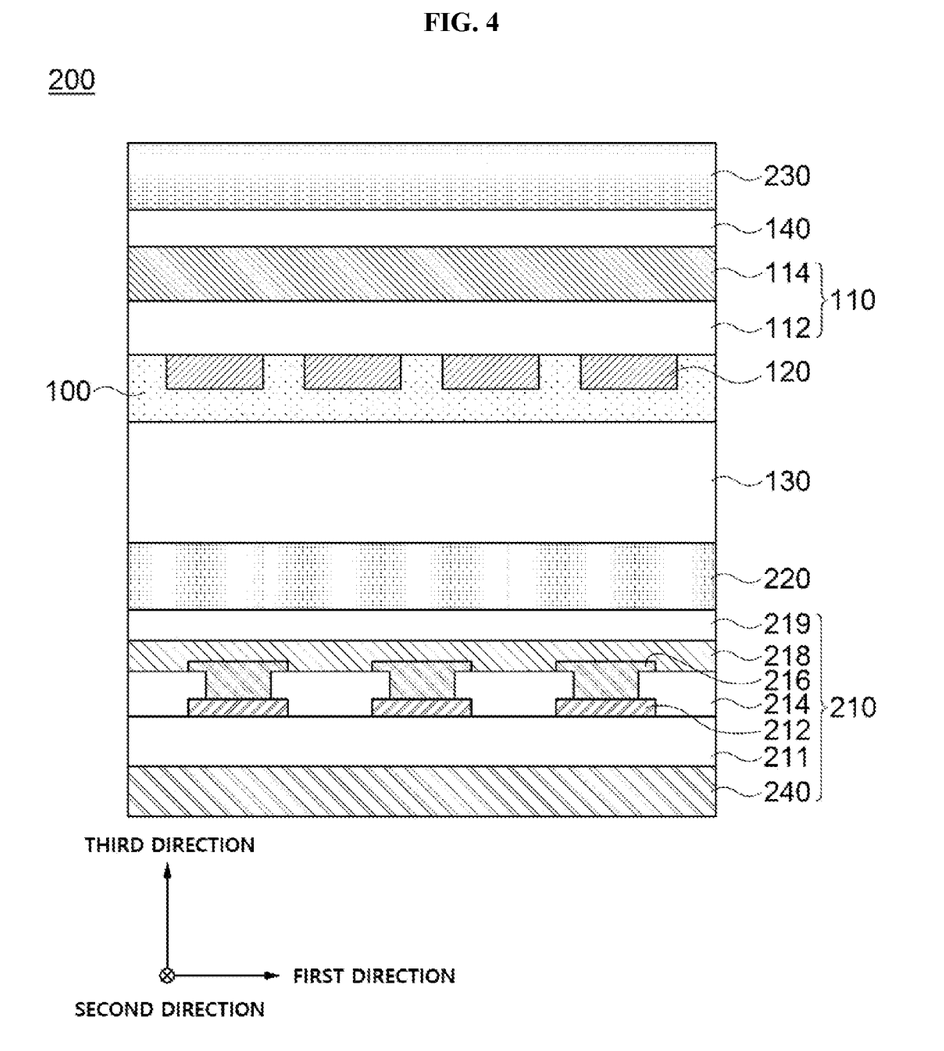
FIGS. 4 and 5 are schematic cross-sectional views illustrating an image display device in accordance with exemplary embodiments.
Figure 5:
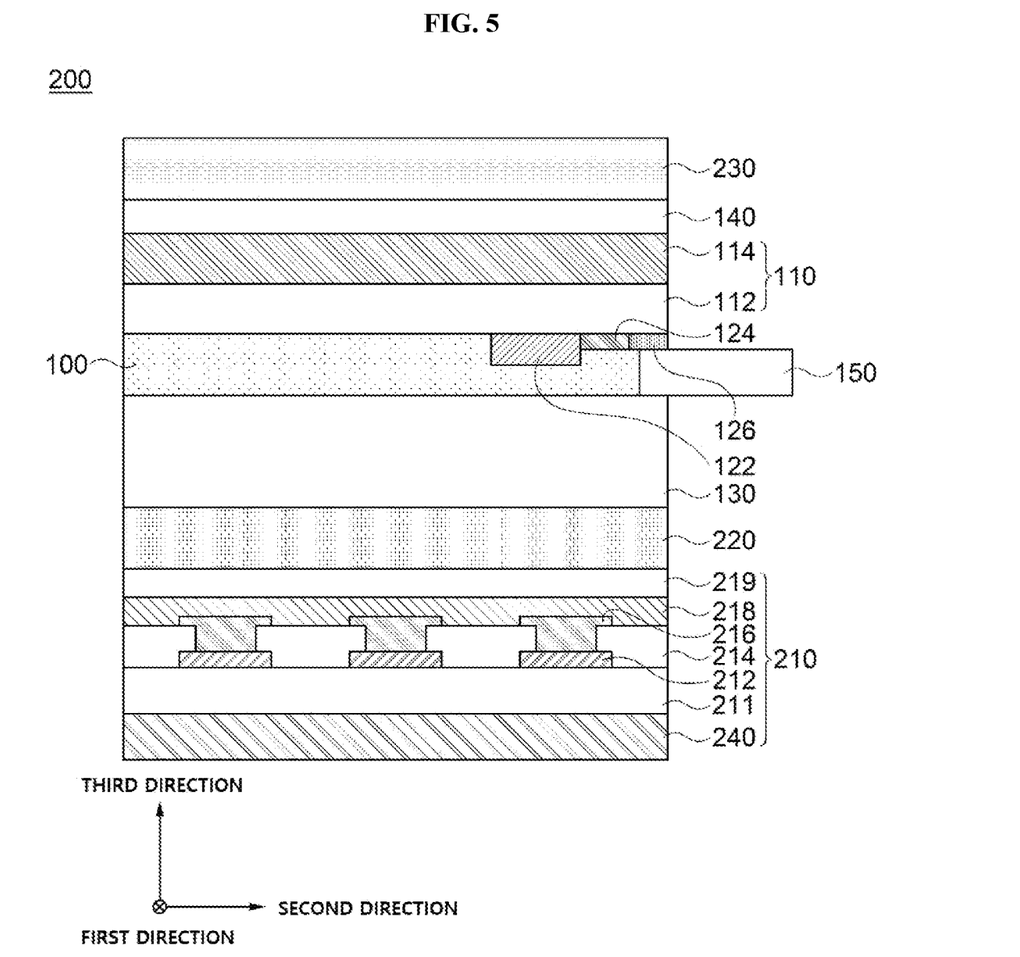

FIGS. 4 and 5 are schematic cross-sectional views illustrating an image display device in accordance with exemplary embodiments.

Referring to FIGS. 4 and 5, the image display device 200 may include a display panel 210 and the above-described antenna structure disposed on the display panel 210. For example, the antenna structure may be stacked on the display panel 210.

The display panel 210 may include a pixel electrode 212, a pixel defining layer 214, a display layer 216, a counter electrode 218 and an encapsulation layer 219 disposed on a panel substrate 211.

A pixel circuit including a thin film transistor (TFT) may be formed on the panel substrate 211, and an insulating layer covering the pixel circuit may be formed. The pixel electrode 212 may be electrically connected to, e.g., a drain electrode of the TFT on the insulating layer.

The pixel defining layer 214 may be formed on the insulating layer to expose the pixel electrode 212 to define a pixel area. The display layer 216 may be formed on the pixel electrode 212, and the display layer 216 may include, e.g., a liquid crystal layer or an organic light emitting layer. Preferably, the display layer 216 may include the organic light emitting layer, and the display panel 210 may be an OLED panel.

The counter electrode 218 may be disposed on the pixel defining layer 214 and the display layer 216. The counter electrode 218 may serve as, e.g., a common electrode or a cathode of the image display device 200. The encapsulation layer 219 for protecting the display panel 210 may be stacked on the counter electrode 218.

In some embodiments, a conductive member included in the display panel 210 may serve as a ground for the antenna unit 120. The conductive member may include, e.g., a gate electrode of the TFT, various wirings such as, a scan line or a data line, or various electrodes such as the pixel electrode 212 and the counter electrode 218.

In an embodiment, various structures including a conductive material disposed under the display panel 210 may serve as an antenna ground. For example, a metal plate (e.g., a stainless-steel plate such as a SUS plate), a pressure sensor, a fingerprint sensor, an electromagnetic wave shielding layer, a heat dissipation sheet, a digitizer, etc., may serve as the ground of the antenna unit 120.

In some embodiments, a ground layer 240 may be disposed under the display panel 210. In this case, the conductive member of the display panel 210 and the ground layer 240 may commonly serve as a ground of the radiator 122. Accordingly, a vertical radiation property from the radiator 122 may be implemented with high efficiency and reliability.

For example, the ground layer 240 may be disposed under the display panel 210 and may be provided as a metal plate, a pressure sensor, a fingerprint sensor, an electromagnetic wave shielding layer, a heat dissipation sheet or a digitizer.

For example, the ground layer 240 may include the above-mentioned metal or alloy.

In some embodiments, a cover window 230 may be disposed on the above-described antenna structure. For example, the cover window 230 may be stacked on a second adhesive layer 140. For example, the insulating layer 110 and the cover window 230 may be attached to each other via the second adhesive layer 140.

For example, a top surface of the insulating layer 110 of the antenna structure may be disposed toward or face the cover window 230. In this case, the top surface of the insulating layer 110 may be closer to the cover window 230 than a bottom surface of the insulating layer 110.

For example, the cover window 230 may serve as a window cover, a cover glass, a protective cover film or a protective cover layer of the image display device. In this case, the cover window 230 may provide a viewing surface or an outermost surface to a user of the image display device 200.

The cover window 230 may include, e.g., glass or a flexible resin material such as polyimide, polyethylene terephthalate, an acrylic resin, a siloxane-based resin, or the like.

In some embodiments, a first adhesive layer 220 may be disposed between the antenna structure and the display panel 210. The first adhesive layer 220 may include, e.g., a transparent resin film, an adhesive material or an inorganic insulating material that may be included in the above-described support layer 100.

For example, a first adhesive layer 130 may adhere the display panel 210 or an optical layer 230 to the antenna structure. In this case, the first adhesive layer 130 may include, e.g., a pressure-sensitive adhesive (PSA) or an optically transparent adhesive (OCA) including an acrylic resin, a silicone-based resin, an epoxy-based resin, etc.

For example, if a distance between the display panel 210 or the ground layer 240 and the antenna unit 120 is excessively small, an applied signal may not form an electric field in the radiator 122 and may be absorbed by the conductive member of the display panel 210 or the ground layer 240 to cause a signal loss.

In some embodiments, the first adhesive layer 130 may have a thickness from 50 μm to 500 μm, and the second adhesive layer 140 may have a thickness from 20 μm to 200 μm.

In this case, improve flexible properties of the antenna structure or the image display device 200 may be achieved while sufficiently providing radiation properties by preventing the signal loss from the antenna unit 120. Accordingly, the antenna structure or the image display device having improved signal efficiency, radiation properties and high reliability may be implemented.

In some embodiments, the thickness of the first adhesive layer 130 may be greater than the thickness of the second adhesive layer 140.

In some embodiments, the optical layer 220 may be disposed between the first adhesive layer 130 and the display panel 210.

The optical layer 220 may be, e.g., a coating-type polarizer or a polarizing layer including a polarizing plate. The coating-type polarizer may include a liquid crystal coating layer including a polymerizable liquid crystal compound and a dichroic dye. In this case, the optical layer 220 may further include an alignment layer for providing an orientation to the liquid crystal coating layer.

For example, the polarizing plate may include a polyvinyl alcohol-based polarizer and a protective film attached to at least one surface of the polyvinyl alcohol-based polarizer.

Hereinafter, a method of manufacturing the image display device 200 according to exemplary embodiments is provided.

For example, a laminate including the insulating layer 110 including the first insulating layer 112 and the second insulating layer 114, and a carrier substrate adhered to the second insulating layer 114 may be prepared. The carrier substrate may include, e.g., an inorganic insulating material such as glass.

The above-described metal or alloy may be patterned on the insulating layer 110 to form the antenna unit 120.

For example, the passivation layer 100 may be formed on the insulating layer 110 so that at least a portion of the antenna unit 120 may be embedded therein. For example, the passivation layer 100 may be formed to cover the radiator 122 and to at least partially expose a top surface of the signal pad 126.

Thereafter, the carrier substrate may be peeled off from the second insulating layer 114, and a protective film may be attached on the second insulating layer 114 to form an antenna structure.

For example, the signal pad 126 of the antenna unit 120 may be bonded to the circuit board 150.

In exemplary embodiments, the above-described antenna structure may be turned upside down and laminated on a stack of the first adhesive layer 130-the optical layer 220-the display panel 210.

Thereafter, the image display device 200 may be formed by laminating the second adhesive layer 140 and the cover window 230 on the insulating layer 110.

Figure 6:
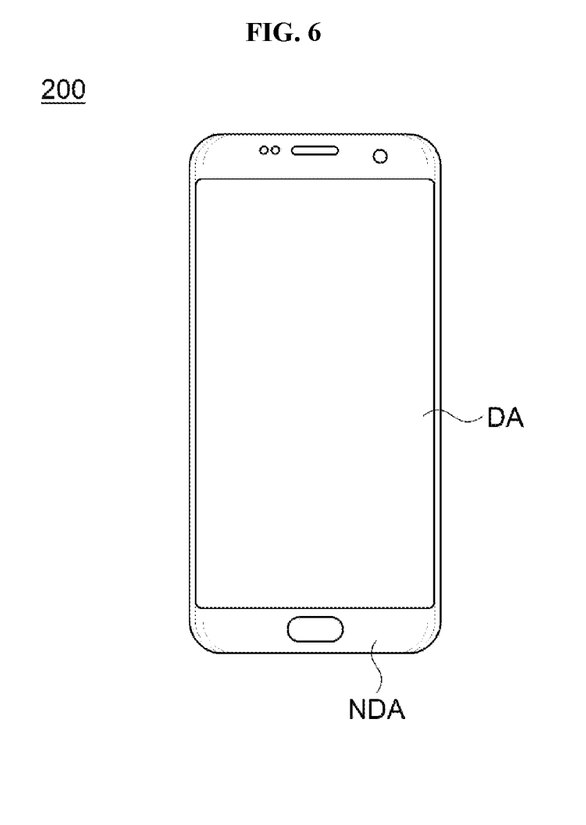
FIG. 6 is a schematic top planar view illustrating an image display device in accordance with exemplary embodiments.

FIG. 6 is a schematic top planar view illustrating an image display device in accordance with exemplary embodiments.

Referring to FIG. 6, the image display apparatus 200 may be fabricated in the form of, e.g., a smart phone, and FIG. 6 illustrates a front portion or a window surface of the image display device 200.

The front portion of the image display device 200 may include a display area DA and a non-display area NDA. The non-display area NDA may correspond to, e.g., a light-shielding portion or a bezel portion of the image display device.

The antenna unit 120 included in the above-described antenna structure may be disposed toward the front portion of the image display device 200, and may be disposed on the display panel 210.

In exemplary embodiments, the above-described antenna structure may be disposed on the display panel 210. In this case, the antenna unit 120 may be integrated with the image display device 200 without an additional substrate layer. Accordingly, thickness and/or volume of the image display device 200 may be reduced, so that bending properties and durability of the image display device 200 may be improved.

In an embodiment, at least portions of the radiator 122 and the transmission line 124 may overlap the display area DA. In this case, at least portions of the radiator 122 and the transmission line 124 may include a mesh-pattern structure, and a reduction of transmittance due to the radiator 122 and the transmission line 124 may be prevented. The signal pad 126 and the ground pad 128 included in the antenna unit 120 may be formed of a solid metal pattern, and may be disposed in the non-display area NDA to prevent deterioration of an image quality.

In some embodiments, the circuit board 150 may be bent and extended to a rear portion of the image display device 200 and may be electrically connected to a main board on which an antenna driving IC chip is mounted. Accordingly, feeding and antenna driving control to the antenna unit 120 through the antenna driving IC chip may be implemented.

As described above, the antenna unit 120 may be substantially integral with the insulating layer 110 or the first adhesive layer 130 of the image display device 200 without the additional antenna substrate layer, so that the thickness of the image display device 200 and the antenna structure may be reduced. Accordingly, the antenna structure and the image display device 200 having flexible properties and high reliability may be obtained.

What is claimed is:

1. An image display device comprising:
    a display panel; and
    an antenna structure comprising:
    a passivation layer;
    an antenna unit at least partially embedded in an upper portion of the passivation layer; and
    an insulating layer disposed on a top surface of the passivation layer to cover the antenna unit,
    wherein the top surface of the passivation layer and a top surface of the antenna unit are coplanar with each other, and
    the antenna structure is stacked on the display panel such that a bottom surface of the passivation layer faces the display panel.

2. The image display device according to claim 1, wherein the antenna unit is spaced apart from a bottom surface of the passivation layer in a thickness direction.

3. The image display device of claim 2, wherein the antenna unit comprises a radiator, a transmission line extending from the radiator and a signal pad connected to a terminal end portion of the transmission line.

4. The image display device of claim 3, wherein the passivation layer covers the radiator, and at least partially exposes the signal pad.

5. The image display device of claim 3, further comprising a first adhesive layer combined with a bottom surface of the passivation layer.

6. The image display device of claim 5, further comprising a circuit board disposed between the first adhesive layer and the antenna unit to be electrically connected to the signal pad of the antenna unit.

7. The image display device of claim 6, a thickness of the first adhesive layer is greater than or equal to a thickness of the circuit board.

8. The image display device of claim 5, further comprising a second adhesive layer formed on a top surface of the insulating layer.

9. The image display device of claim 1, wherein the insulating layer comprises a first insulating layer and a second insulating layer sequentially stacked from the top surface of the passivation layer; and
    the first insulating layer and the second insulating layer include different insulating materials from each other.

10. The image display device of claim 1, further comprising a ground layer disposed under the display panel.

11. The image display device of claim 1, further comprising:
    a first adhesive layer formed between the bottom surface of the passivation layer and the display panel; and
    a second adhesive layer formed on a top surface of the insulating layer of the antenna structure.

12. The image display device of claim 11, wherein a thickness of the first adhesive layer is from 50 μm to 500 μm, and a thickness of the second adhesive layer is from 20 μm to 200 μm.

13. The image display device of claim 11, further comprising a cover window disposed on the second adhesive layer.

14. The image display device of claim 11, further comprising an optical layer disposed between the first adhesive layer and the display panel.

* * * * *